United States Patent
Mulligan et al.

(10) Patent No.: US 6,838,299 B2
(45) Date of Patent: Jan. 4, 2005

(54) FORMING DEFECT PREVENTION TRENCHES IN DICING STREETS

(75) Inventors: Rose A. Mulligan, Chandler, AZ (US); Jun He, Portland, OR (US); Thomas Marieb, Portland, OR (US); Susanne Menezes, Portland, OR (US); Steven Towle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 349 days.

(21) Appl. No.: 09/997,086

(22) Filed: Nov. 28, 2001

(65) Prior Publication Data

US 2003/0100143 A1 May 29, 2003

(51) Int. Cl.[7] .......................... H01L 21/00; H01L 21/44
(52) U.S. Cl. ....................... 438/33; 438/114; 438/465
(58) Field of Search ............................. 438/460–465, 438/33, 113–114

(56) References Cited

U.S. PATENT DOCUMENTS

| 5,024,970 A | * | 6/1991 | Mori | 148/DIG. 28 |
| 6,306,731 B1 | * | 10/2001 | Igarashi et al. | 438/113 |
| 6,365,958 B1 | * | 4/2002 | Ibnabdeljalil et al. | 257/619 |

FOREIGN PATENT DOCUMENTS

DE 19840508 * 12/1999 ........... H01L/21/78

OTHER PUBLICATIONS

S. Wolf and R.N. Tauber, "Silicon Processing for the VLSI Era vol. 1–Process Technology", 1986 by Lattice Press, vol. 1, Chapter 16.*

* cited by examiner

*Primary Examiner*—David S Blum
(74) *Attorney, Agent, or Firm*—Rob G. Winkle (57) ABSTRACT

A method of dicing a microelectronic device wafer comprising forming at least one trench in at least one dicing street on the microelectronic device wafer, wherein the trench prevents cracking and/or delamination problems in the interconnect layer of the microelectronic device wafers caused by a subsequent dicing by a wafer saw.

20 Claims, 10 Drawing Sheets

FORMING DEFECT PREVENTION TRENCHES IN DICING STREETS

BACKGROUND OF THE INVENTION

1. Field of the Invention

The present invention relates to the dicing of microelectronic device wafers into individual microelectronic dice. In particular, the present invention relates to forming trenches in the dicing streets of a microelectronic device wafer. These trenches assist in the prevention of defects, such as cracks and delamination, from forming and/or propagating in the interconnect layer of the integrated circuitry of the microelectronic device wafer.

2. State of the Art

Figure 15:
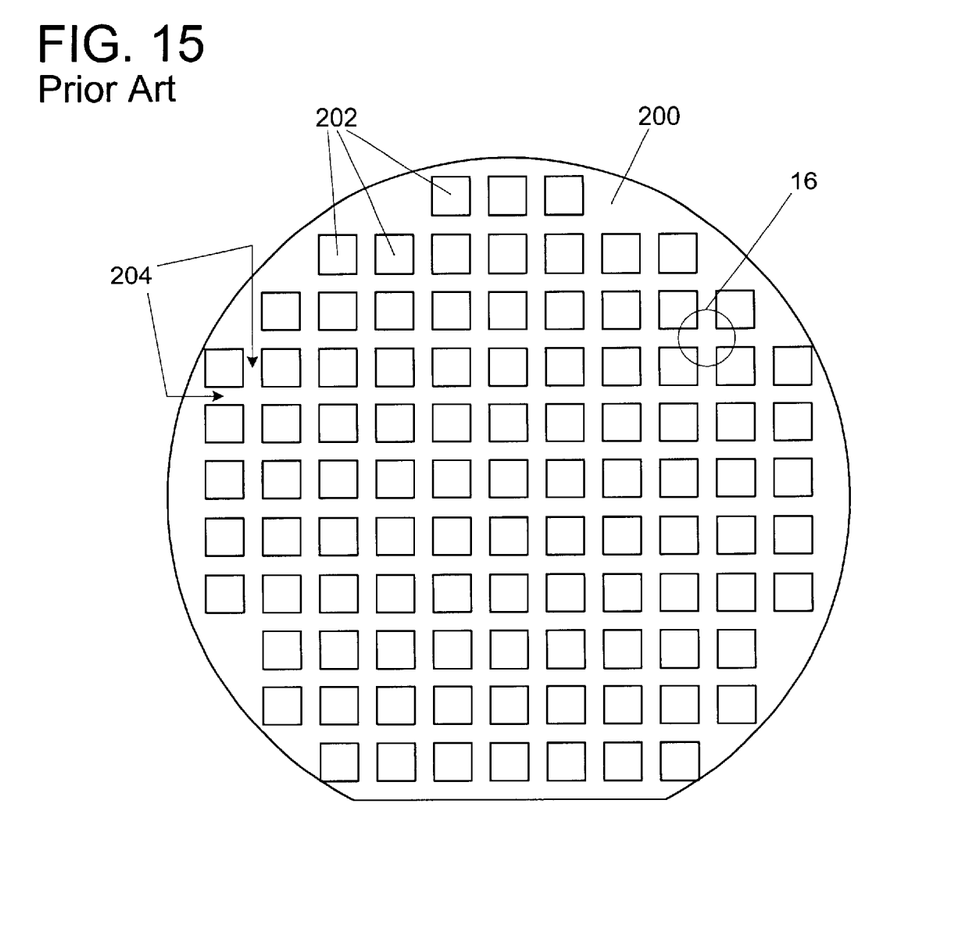
FIG. 15 is a top plan view of a conventional microelectronic device wafer having a plurality of unsingulated microelectronic devices, as known in the art.

In the production of microelectronic devices, integrated circuitry is formed in and on semiconductor wafers, which is usually comprised primarily of silicon, although other materials such as gallium arsenide and indium phosphide may be used. As shown in FIG. 15, a single microelectronic device wafer 200 may contain a plurality of substantially identical integrated circuits 202, which are usually substantially rectangular and arranged in rows and columns. Two sets of mutually parallel dicing streets 204 extend perpendicular to each other over substantially the entire surface of the semiconductor wafer 200 between each discrete integrated circuit 202.

After the integrated circuits 202 on the microelectronic device wafer 200 have been subjected to preliminary testing for functionality (wafer sort), the microelectronic device wafer 200 is diced (cut apart), so that each area of functioning integrated circuitry 202 becomes a microelectronic die that can be used to form a packaged microelectronic device. One exemplary microelectronic wafer dicing process uses a circular diamond-impregnated dicing saw, which travels down two mutually perpendicular sets of lines or "dicing streets" 204 lying between each of the rows and columns. Of course, the dicing streets 204 must be sized to allow passage of a wafer saw blade between adjacent integrated circuits 202 without causing damage to the circuitry.

Figure 16:
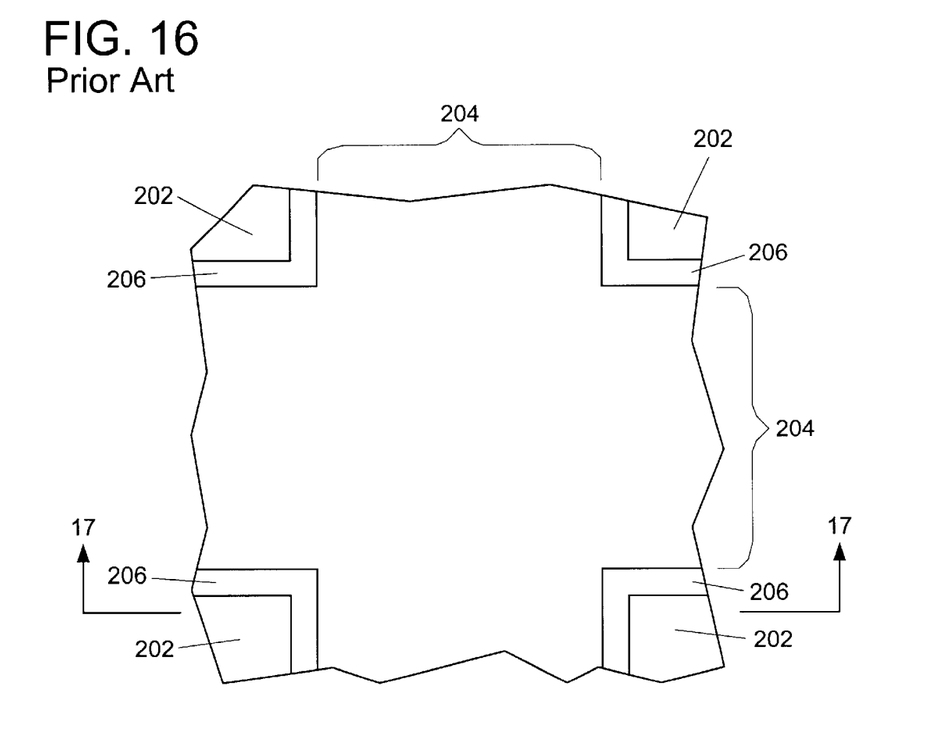
FIG. 16 is a top plan close-up view of insert 16 of FIG. 15 showing the dicing street areas, as known in the art.
Figure 17:
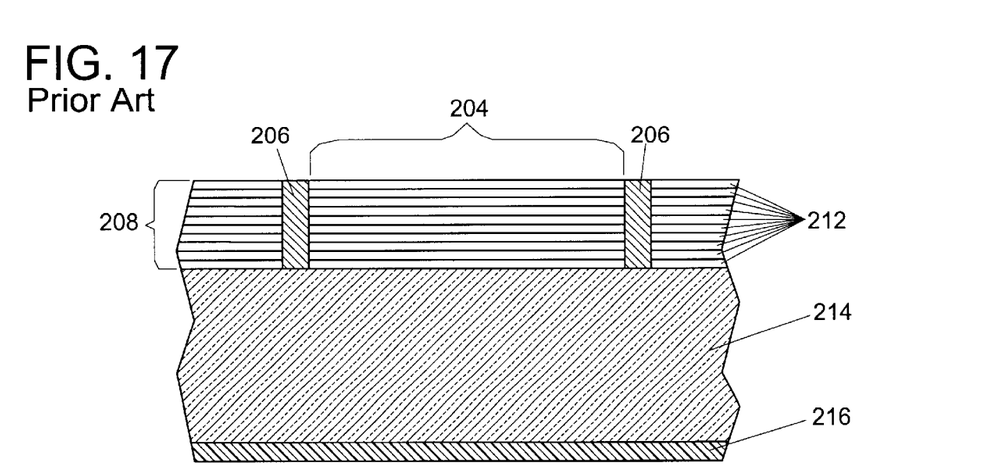
FIG. 17 is a side cross-sectional view of the dicing street areas of a microelectronic device wafer along line 17—17 of FIG. 16, as known in the art.

As shown in FIGS. 16 and 17, a microelectronic device wafer 200 may have guard rings 206 which substantially surround the integrated circuit 202. The guard rings 206 extend though an interconnect layer 208 (see FIG. 17). The interconnect layer 208 comprises layers 212 consisting of metal traces layer separated by dielectric material layers on a semiconductor wafer 214. The interconnect layer 208 provides routes for electrical communication between integrated circuit components within the integrated circuits. The guard ring 206 is generally formed layer by layer as the interconnect layer 208 is formed. The guard ring 206 assists in preventing external contamination encroaching into the integrated circuitry 202 between the interconnect layer 208.

Figure 18:
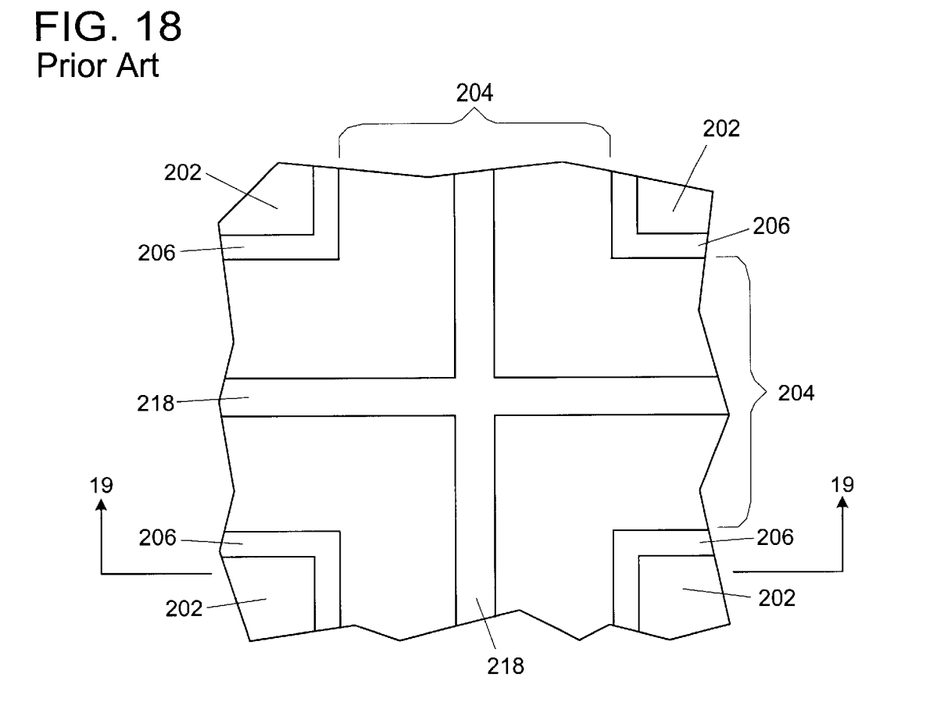
FIG. 18 is a top plan view of the microelectronic device wafer of FIGS. 16 and 17 after wafer dicing, as known in the art.
Figure 19:
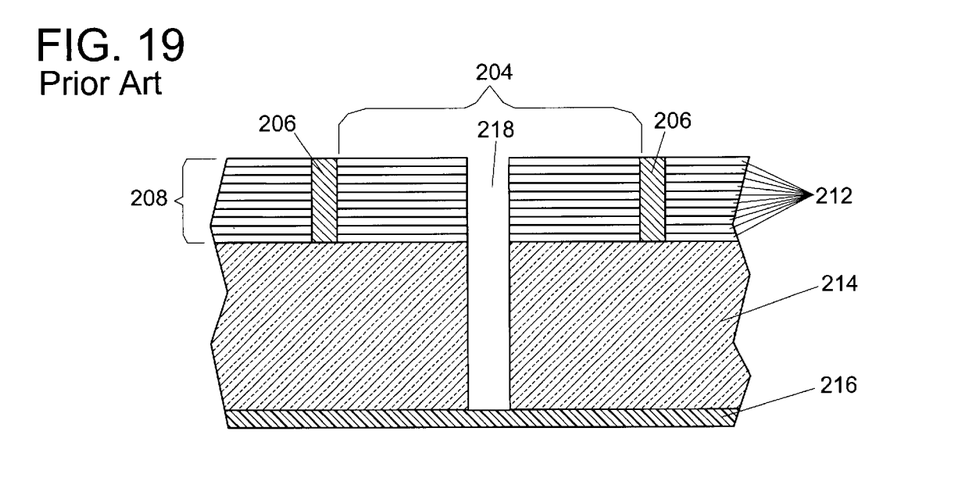
FIG. 19 is a side cross-sectional view of the dicing street areas of the microelectronic device wafer along line 19—19 of FIG. 18, as known in the art.

Prior to dicing, the microelectronic device wafer 200 is mounted onto a sticky, flexible tape 216 (shown in FIG. 17) that is attached to a ridge frame (not shown). The tape 216 continues to hold the microelectronic die after the dicing operation and during transport to the next assembly step. As shown in FIGS. 18 and 19, a saw cuts a channel 218 in the dicing street 204 through the interconnect layer 208 and the semiconductor wafer 214. During cutting, the saw generally cuts into the tape 216 to up to about one-third of its thickness.

However, in the dicing of microelectronic device wafers 200, the use of industry standard dicing saws (metal impregnated with diamond) results in a rough edge along the interconnect layer 208 and results in stresses being imposed on the interconnect layer 212. This effect is most prevalent with the interconnect layer 208 having ductile copper traces or interconnects. This rough edge and the stresses imposed is a source of crack propagation into and/or delamination of the interconnect layer 208, through the guard ring 206, and into the integrated circuitry 202 causing fatal defects. These defects are increasing as the device material properties move toward weaker adhesions and strengths in order to meet various electrical property requirements.

Therefore, it would be advantageous to develop techniques to effectively dice microelectronic device wafers while reducing or substantially eliminating the possibility of crack and delamination propagation.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes forming at least one trench in the interconnect layer of a microelectronic device wafer such that at least one wall of the each trench will be positioned on either side of where a wafer saw will cut through the microelectronic device wafer.

Figure 1:
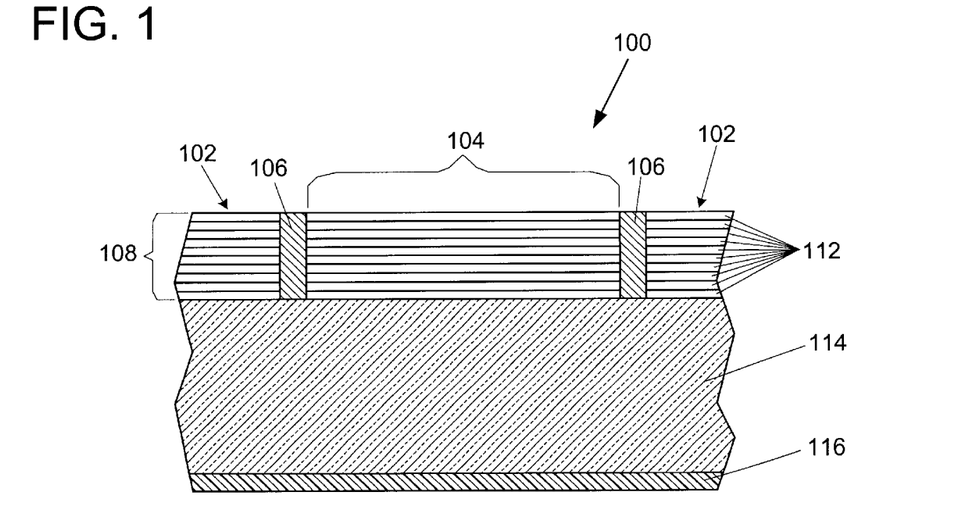
FIG. 1 is a side cross-sectional view of a microelectronic device wafer, according to the present invention.

FIG. 1 illustrates a microelectronic device wafer 100 similar to the microelectronic device wafer 200 of FIGS. 15 and 16 comprising a semiconductor wafer 114, including, but not limited to, silicon, gallium arsenide and indium phosphide, mounted onto a sticky, flexible tape 116 and an interconnect layer 108 disposed on the semiconductor wafer 114. It is, of course, understood that the use of the term "wafer" does not only include an entire wafer, but also includes portions thereof.

The interconnect layer 108 is generally alternating layers 112 of dielectric material, including but not limited to silicon dioxide, silicon nitride, epoxy resin, polyimide, bisbenzocyclobutene, fluorinated silicon dioxide, carbon-doped silicon dioxide, silicon carbide, various polymeric dielectric materials (such as SiLK available for Dow Chemical, Midland, Mich.), and the like, and patterned electrically conductive material, including copper, aluminum, silver, titanium, alloys thereof, and the like. The methods and processes for fabricating the interconnect layer 108 as well as the minor constituent materials in the various layer thereof will be evident to those skilled in the art.

As previously discussed, a plurality of dicing streets 104 separates the individual integrated circuitry 102. Generally the dicing streets 104 run perpendicularly to separate the integrated circuitry 102 into rows and columns. Preferably, at least one guard ring 106 isolates integrated circuitry 102 from dicing streets 104, as discussed previously in relation to FIGS. 15 and 16. Within the dicing streets 104, there are typically test structures that are composed of the same materials as the other parts of the interconnect layer 108. Between these test structures in the dicing street 104 and the guard ring 106 may be a region or regions composed entirely of dielectric material with no conductive material. In the embodiments of the present invention that comprise two trenches, as will be described, these trenches may be placed such that they fall entirely within the regions composed entirely of dielectric material.

Figure 2:
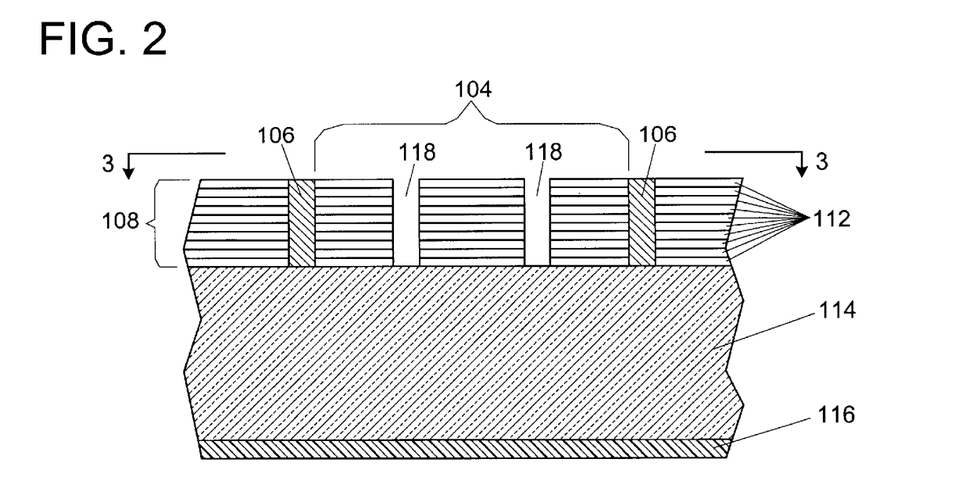
FIG. 2 is a side cross-sectional view of dual defect prevention trenches formed by a laser in the interconnect layer of a microelectronic device wafer dicing street area, according to the present invention.
Figure 3:
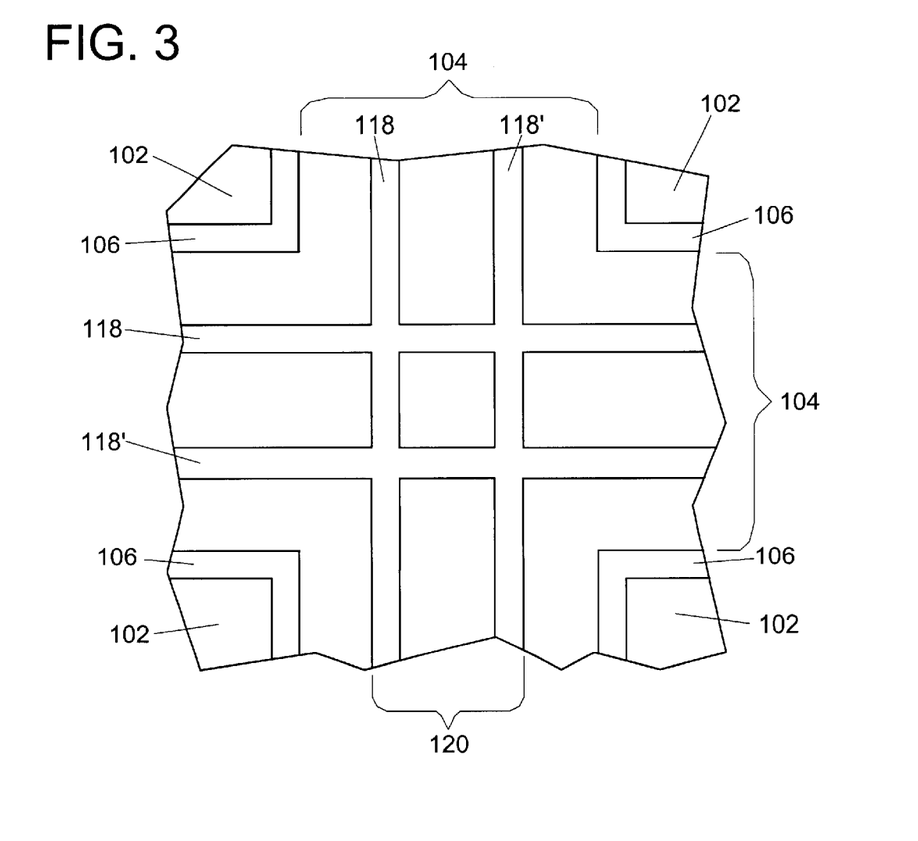
FIG. 3 is a top plan view of the dual defect prevention trenches of FIG. 2 along lines 3—3, according to the present invention.

One embodiment of the present invention includes using a laser, such as a Nd:YAG Laser (amplifying medium of neodymium-doped yttrium aluminium garnate (YAG)) (for example, a Model 2700 Micromachining System made by Electro Scientific Industries, Inc. of Portland, Oreg., USA), to ablate away two trenches (first trench 118 and second 118'), for example about 80 microns wide, on each of the dicing streets 104 (both row and column) to a depth of about 10 microns (deeper ablation limits laser speed and increases debris but also enables faster saw process). The first trench 118 and the second trench 118' are positioned to reside on either side of the dicing street 104 where a saw will cut when dicing the microelectronic device wafer 100, as shown in FIGS. 2 and 3. The first trench 118 and the second trench 118' preferably extend completely through the interconnect layer 108. It is, of course, understood that process parameters, such as the type of laser, power settings thereof, duration of ablation, and width of the ablation line will vary depending on the type of dielectric material layers and conductive material layers, as will be evident to those skilled in the art.

Lasers are generally not used in microelectronic device wafer dicing, because they cut/ablate too slowly through the entire thickness of the microelectronic device wafer. Furthermore, laser ablation generates debris that can cause contamination of microelectronic device wafers and processing equipment. However, it has been found that the laser can cut quickly through the interconnect layers 108 with a minimum of debris. Since a laser cuts/ablates smooth-sided trenches, the first trench 118 and the second trench 118' will not propagate cracks in or cause delamination of the layers comprising the interconnect layer 108; instead the wafer saw edges will intersect the wafer only within the underlying silicon substrate where crack formation is not a problem.

Figure 4:
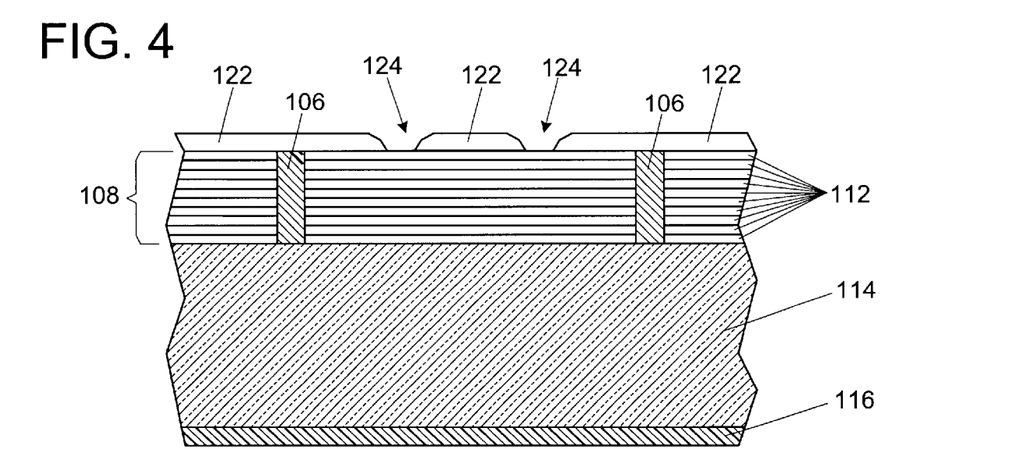
FIGS. 4 and 5 are side cross-sectional views of the dual defect prevention trenches formed by etching of the interconnect layer of a microelectronic device wafer, according to the present invention.
Figure 5:
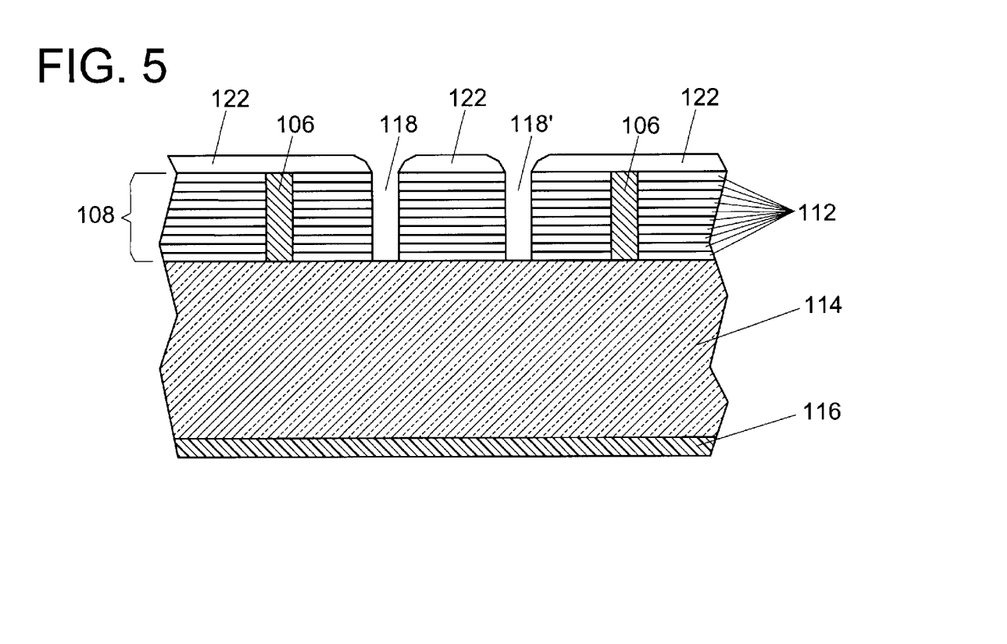

Of course, the present invention is not limited to the use of a laser. In another embodiment of the present invention shown in FIGS. 4 and 5, an etching technique is used to form the first trench 118 and the second trench 118'. Such a process utilizes well-characterized processes known in the art. First, a resist material 122, either positive (e.g., diazoquinone/novolac resin, and the like) or negative (e.g., poly (p-t-butyloxycarbonyl-oxystyrene), and the like), is applied and patterned on the interconnect layers 108, such that openings 124 are created in areas where a trench is desired, as shown in FIG. 4. As the entire thickness of the interconnect layer 108 is preferably removed, a relatively thick resist layer (approximately between about 1 and 5 micrometers) will need to be applied unless the etching selectivity is very high. As shown in FIG. 5, the interconnect layer 108 is then etched to form the first trench 118 and the second trench 118' through to the semiconductor wafer 114. The etching material is highly dependent on whether the etch process is dry or wet and on the nature of the material used in the interconnect layer 108 which are to be etched. However, the etching material may include, but is not limited to, oxalyl fluoride, pentafluoroethane, 1,1-difluoroethane, hydrofluoride, sulfuric acid, oxygen plasma, fluorine plasma, chlorine plasma, and the like. In one embodiment, the region in which the trenches are to be etched is composed of dielectric material only. It is, of course, understood that multiple etching steps with different etching materials may be required depending on the selected dielectric layer materials and conductive layer materials.

For example, if the dielectric material is comprised of silicon dioxide, the etching material may include, but is not limited to a mixture of Ar, $CF_4$, and CO. The process may be conducted in a parallel plate plasma system (also known as a reactive ion etcher) with the etching gases delivered through a perforated upper plate or showerhead. The appropriate values for the RF power, plate separation, and other process parameters will be dependent on the particular tool used for the process. Of course, other types of etch equipment may also be used, as will be evident to those skilled in the art.

Figure 6:
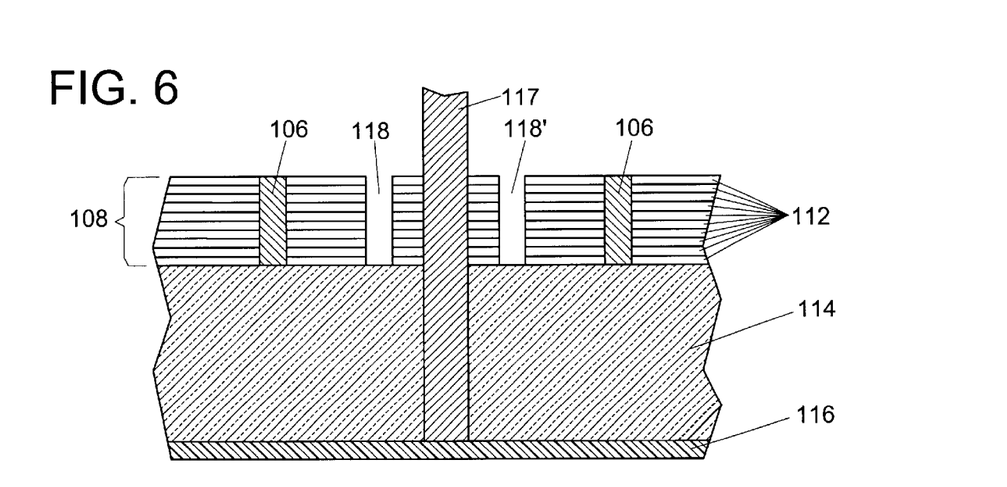
FIG. 6 is a side cross-sectional view of the microelectronic device wafer of FIGS. 2 and 3 or FIGS. 4 and 5 during conventional wafer dicing, according to the present invention.
Figure 7:
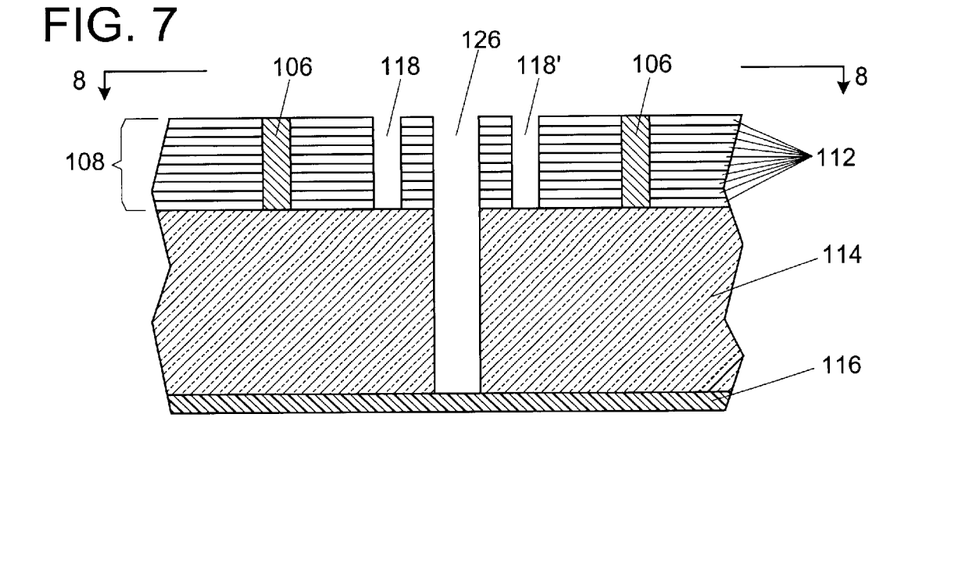
FIG. 7 is a side cross-sectional view of the microelectronic device wafer of FIGS. 2 and 3 or FIGS. 4 and 5 after conventional wafer dicing, according to the present invention.
Figure 8:
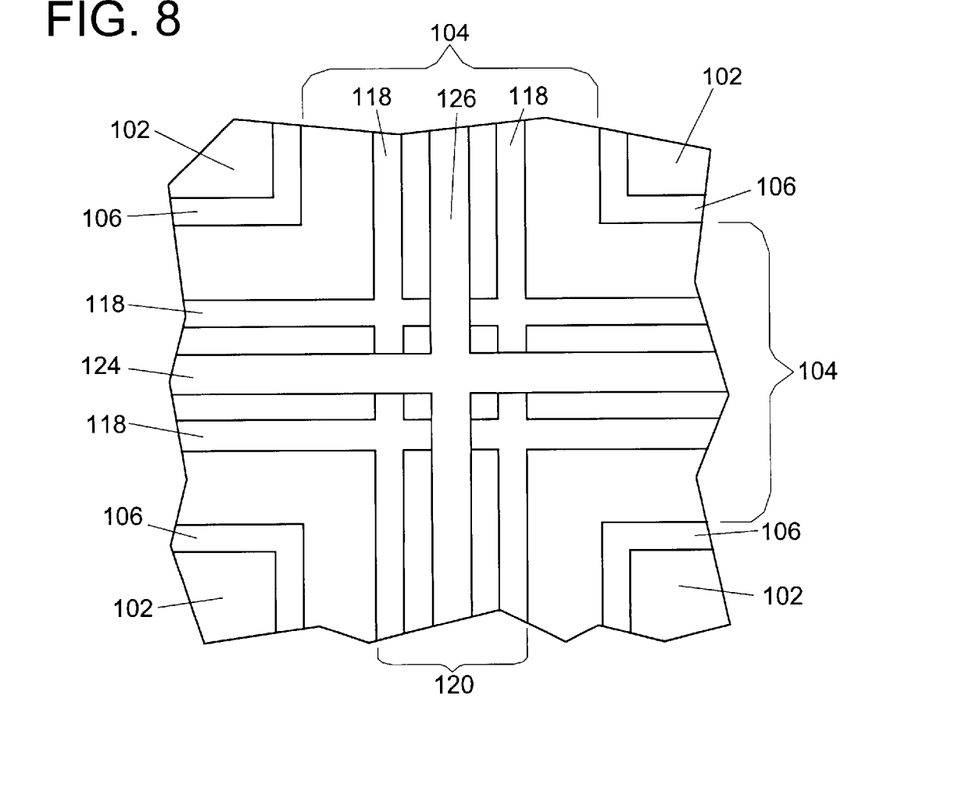
FIG. 8 is a top plan view of the microelectronic device wafer of FIG. 7 along lines 8—8, according to the present invention.
Figure 9:
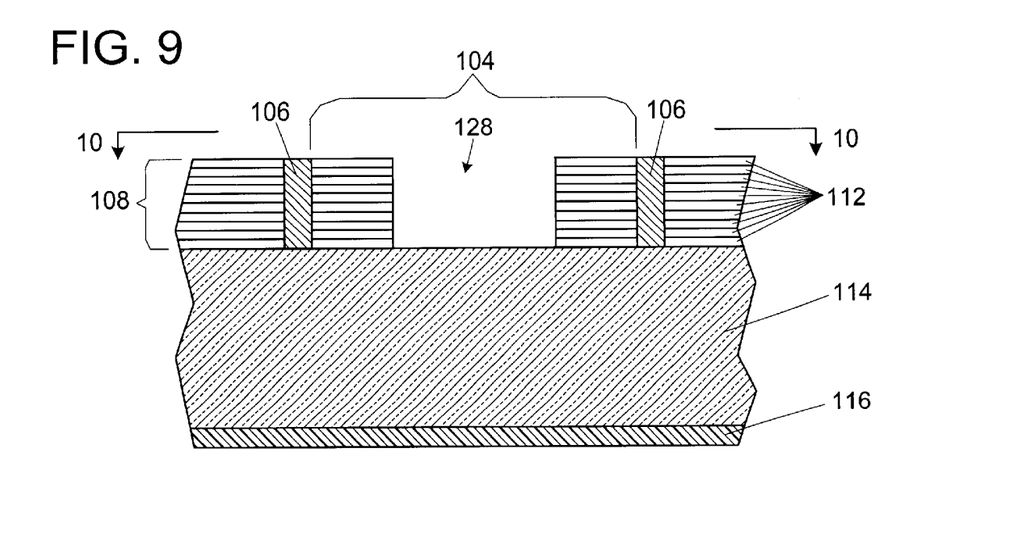
FIG. 9 is a side cross-sectional view of a single defect prevention trench formed by a laser in the interconnect layer of a microelectronic device wafer dicing street area, according to the present invention.
Figure 10:
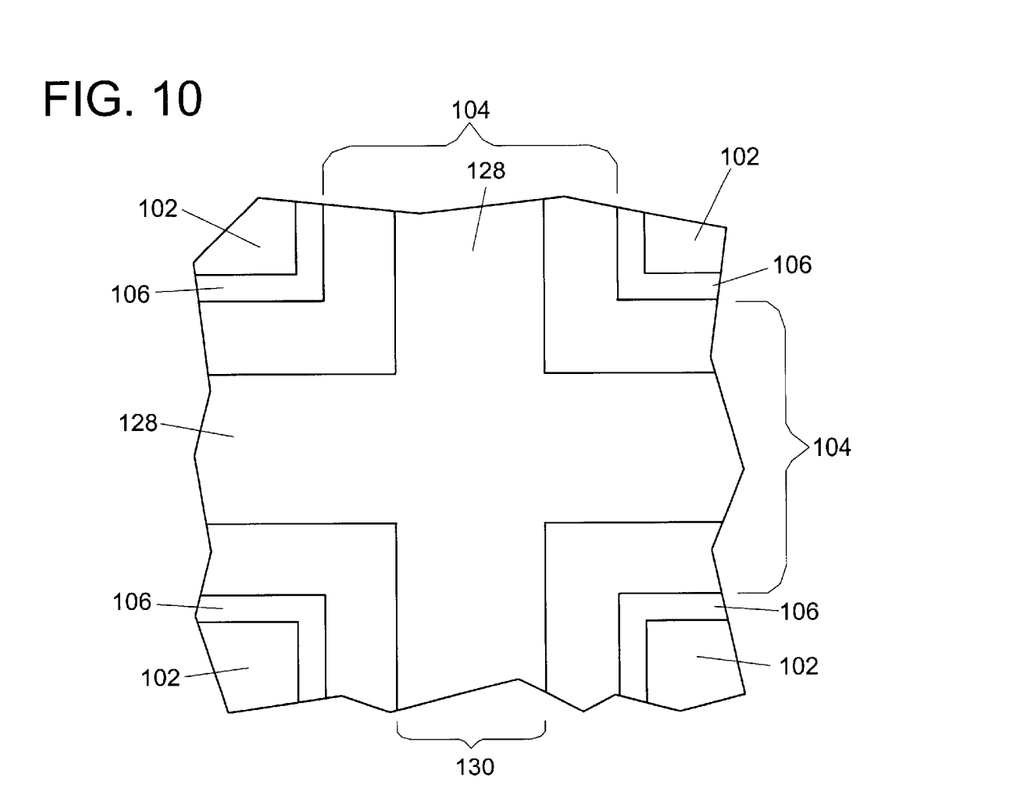
FIG. 10 is a top plan view of the single defect prevention trench of FIG. 9 along lines 10—10, according to the present invention.
Figure 11:
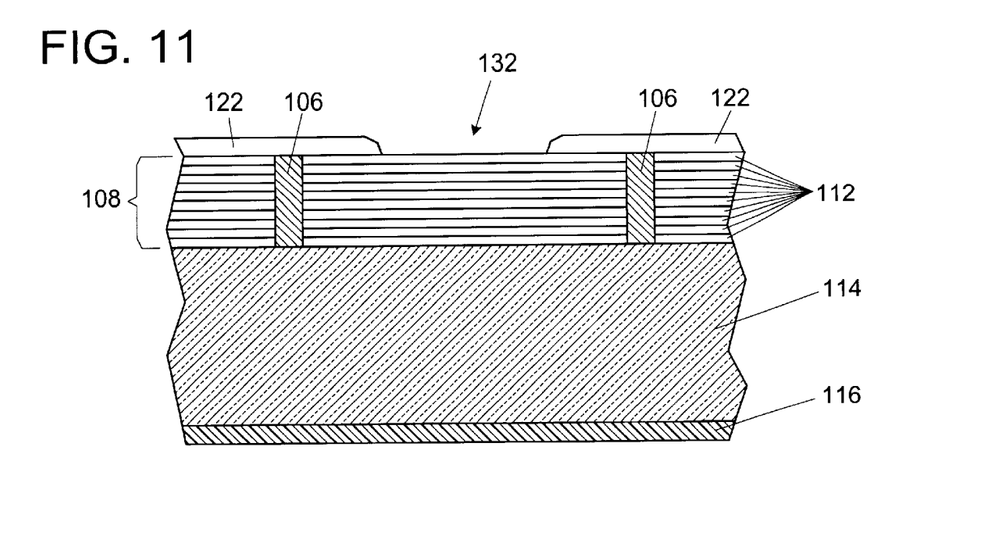
FIGS. 11 and 12 are side cross-sectional views of the single defect prevention trench formed by etching of the interconnect layer of a microelectronic device wafer, according to the present invention.
Figure 12:
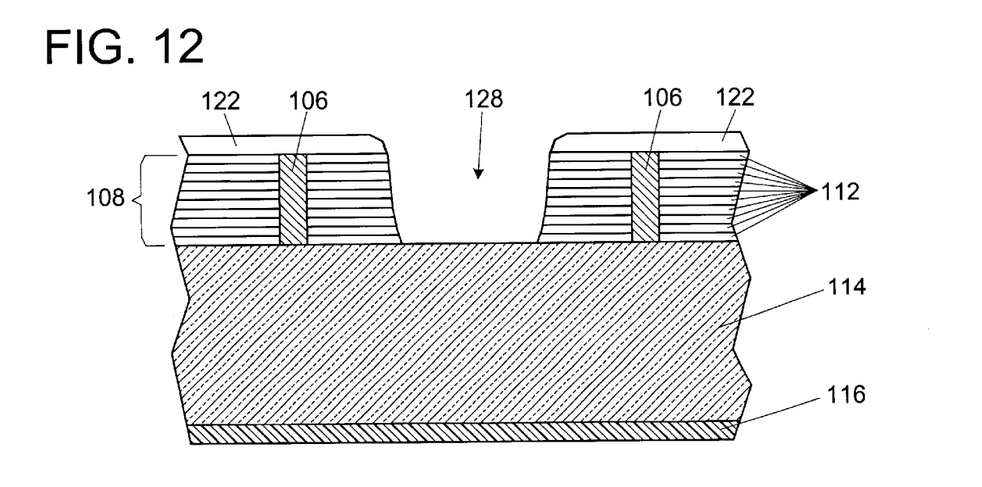

After the formation of the first trench 118 and the second trench 118' and, if an etching process is used, after the removal of the resist material, a wafer saw 117 (see FIG. 6) cuts a channel 126 between the first trench 118 and the second trench 118', through the interconnect layer 108, and through the semiconductor wafer 114, as shown in FIGS. 7 and 8. Of course, the width of the saw cut (kerf) must be smaller than the distance 120 between the first trench 118 and the second trench 118'.

FIGS. 9–14 illustrate another embodiment of the present invention. Instead of forming two individual trenches, as shown in FIGS. 2–8, a single, wide trench 128 is formed. The wide trench 128 should be wide enough to eliminate any interaction of a wafer saw and the interconnect layer 108 during the dicing of the microelectronic device wafer. The elimination of any interaction between the wafer saw and the interconnect layer 108 eliminates the potential of any defects being generated in the interconnect layer 108 by the wafer saw.

Figure 13:
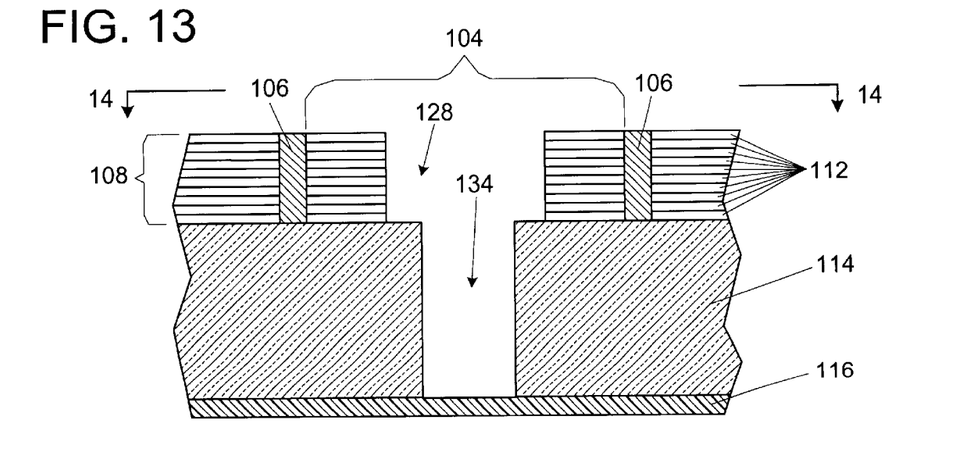
FIG. 13 is a side cross-sectional view of the microelectronic device wafer of FIGS. 9 and 10 or FIGS. 11 and 12 after conventional wafer dicing, according to the present invention.
Figure 14:
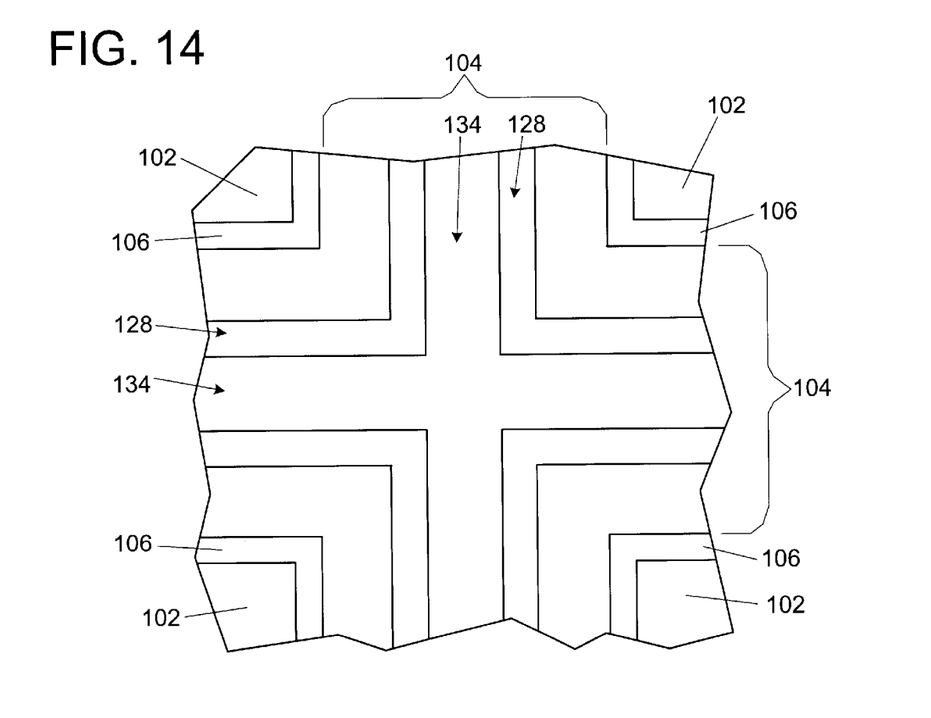
FIG. 14 is a top plan view of the microelectronic device wafer of FIG. 13 along lines 14—14, according to the present invention.

The single wide trench 128 may be formed by a laser, as discussed above and shown in FIGS. 9 and 10, by etching, as discussed above and shown in FIGS. 11 and 12, or by any method of forming such a trench, as known in the art. After the formation of the wide trench 128 and, if an etching process is used, after the removal of the resist material 122, a wafer saw is placed within the wide trench 128 and it cuts a channel 134 through the semiconductor wafer 114, as shown in FIGS. 13 and 14. Of course, the kerf of the saw cut must be smaller than the width 130 of the wide trench 128.

It is, of course, understood that if the etch chemistry is optimized for dielectric removal, all of the structure within the dicing street may not be removed during the etching process. However, the formation of cracks which can propagate into the interconnect layer 108 will be prevented as long as there is a region outside the saw kerf where all material is removed. As discussed since above the region between the street structures and the guard ring is entirely composed of dielectric material, this condition will be satisfied.

Although it is preferred that the trenches be formed before the microelectronic device wafer is diced, the trenches of the present invention may be formed after dicing. Furthermore, if wafer thinning (as known in the art) is required, it is preferred that etching of the trench or trenches occurs before the grinding, because when the semiconductor wafer 114 is at its full thickness, as it simplifies the etching process. Also, it allows the photoresist to be left on during the grinding to protect the interconnect layer 108.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of dicing a microelectronic device wafer, comprising:

providing a microelectronic device wafer comprising a semiconductor wafer having an interconnect layer disposed thereon, said microelectronic device including at least two integrated circuits formed therein separated by at least one dicing street;

forming at least one trench through said interconnect layer within said at least one dicing street;

cutting through said semiconductor wafer within said at least one dicing street.

2. The method of claim 1, wherein forming said at least one trench comprises laser ablating said at least one trench through said interconnect layer within said at least one dicing street.

3. The method of claim 1, wherein forming said at least one trench comprises:

patterning a resist material on said interconnect layers, wherein said patterning said resist material forms an opening through said resist material over said at least one dicing street to expose at least a portion of said interconnect layer; and etching said interconnect layer to said semiconductor wafer.

4. The method of claim 3, wherein etching said interconnect layer comprises plasma etching said interconnect layer.

5. The method of claim 3, wherein forming said at least one trench further includes removing said resist material after said etching.

6. The method of claim 1, wherein cutting through said semiconductor wafer includes cutting through said interconnect layer.

7. The method of claim 1, wherein cutting through said semiconductor wafer includes cutting through said semiconductor wafer with a wafer saw.

8. The method of claim 1, wherein cutting through said semiconductor wafer occurs after said forming at least one trench through said interconnect layer.

9. A method of dicing a microelectronic device wafer, comprising:

providing a microelectronic device wafer comprising a semiconductor wafer having an interconnect layer disposed thereon, said microelectronic device including at least two integrated circuits formed therein separated by at least one dicing street;

forming at least two trenches through said microelectronic device wafer interconnect layer within said at least one dicing street;

cutting at least one channel through said interconnect layer between said at least two trenches and through said semiconductor wafer.

10. The method of claim 9, wherein forming said at least two trenches comprises laser ablating said least two trenches through said interconnect layer within said at least one dicing street.

11. The method of claim 9, wherein forming said at least two trenches comprises:

patterning a resist material on said interconnect layer, wherein said patterning said resist material forms at least two openings through said resist material over said at least one dicing street to expose at least a portion of said interconnect layer; and etching said interconnect layer to said semiconductor wafer.

12. The method of claim 11, wherein etching said interconnect layer comprises plasma etching said interconnect layer.

13. The method of claim 11, wherein forming said at least two trenches further comprises removing said resist material.

14. The method of claim 9, wherein cutting through said semiconductor wafer includes cutting through said semiconductor wafer with a wafer saw.

15. A method of dicing a microelectronic device wafer, comprising:

providing a microelectronic device wafer comprising a semiconductor wafer having an interconnect layer disposed thereon, said microelectronic device including at least two integrated circuits formed therein separated by at least one dicing street;

forming at least one wide trench through said microelectronic device wafer interconnect layer within said at least one dicing street;

placing a wafer saw within said at least one wide trench and cutting at least one channel through said semiconductor wafer.

16. The method of claim 15, wherein forming said at least one wide trench comprises laser ablating said least one wide trench through said interconnect layer within said at least one dicing street.

17. The method of claim 15, wherein forming at least one wide trench comprises:

patterning a resist material on said interconnect layer, wherein said patterning said resist material forms an opening through said resist material over said at least one dicing steel to expose at least a portion of said interconnect layer; and etching said interconnect layer to said semiconductor wafer.

18. The method of claim 17, wherein etching said interconnect layer comprises plasma etching said interconnect layer.

19. The method of claim 17, wherein forming said at least one wide trench further comprises removing said resist material.

20. The method of claim 15, wherein cutting through said semiconductor wafer includes cutting through said semiconductor wafer with a wafer saw.

* * * * *

UNITED STATES PATENT AND TRADEMARK OFFICE
CERTIFICATE OF CORRECTION

PATENT NO. : 6,838,299 B2
DATED : January 4, 2005
INVENTOR(S) : Mulligan et al.

It is certified that error appears in the above-identified patent and that said Letters Patent is hereby corrected as shown below:

Column 8,
Line 12, delete "steel" and insert -- street --.

Signed and Sealed this

Twenty-sixth Day of April, 2005

JON W. DUDAS
*Director of the United States Patent and Trademark Office*